US010649471B2

(12) United States Patent
Ding et al.

(10) Patent No.: US 10,649,471 B2
(45) Date of Patent: May 12, 2020

(54) METHOD AND APPARATUS FOR PULSE GAS DELIVERY WITH ISOLATION VALVES (71) Applicant: MKS Instruments, Inc., Andover, MA (US)

(72) Inventors: Junhua Ding, Boxborough, MA (US); Michael L'Bassi, Sterling, MA (US); Gordon Hill, Arlington, MA (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 15/887,447

(22) Filed: Feb. 2, 2018

(65) Prior Publication Data
US 2019/0243392 A1 Aug. 8, 2019

(51) Int. Cl.
*F16K 31/02* (2006.01)
*G05D 7/06* (2006.01)
*G01F 15/00* (2006.01)
*C23C 16/455* (2006.01)
*C23C 16/52* (2006.01)
*G01F 1/36* (2006.01)

(52) U.S. Cl.
CPC ..... *G05D 7/0647* (2013.01); *C23C 16/45525* (2013.01); *C23C 16/52* (2013.01); *G01F 1/36* (2013.01); *G01F 15/005* (2013.01); *G01F 1/363* (2013.01)

(58) Field of Classification Search
CPC .......... G05D 7/0647; C23C 16/45525; C23C 16/52; C23C 16/45523; G01F 1/36; Y10T 137/0363; Y10T 137/7761
USPC ................................................ 137/487.5, 12
See application file for complete search history.

(56) References Cited

U.S. PATENT DOCUMENTS 5,865,205 A * 2/1999 Wilmer ................ G05D 7/0635
137/2
6,125,869 A * 10/2000 Horiuchi ............. F16K 37/0091
137/1
6,152,168 A * 11/2000 Ohmi .................... G05D 7/0647
137/486

(Continued)

FOREIGN PATENT DOCUMENTS

WO   2012116281 A1   8/2012
WO   2015/138085 A1  9/2015

OTHER PUBLICATIONS

Ding, et al., "Pulse Gas Delivery Mass Flow Controllers for TSV Applications," 2016 China Semiconductor Technology International Conference (CSTIC) pp. 1-3, Mar. 1, 2016.

(Continued)

*Primary Examiner* — Minh Q Le
(74) *Attorney, Agent, or Firm* — Hamilton, Brook, Smith & Reynolds, P.C.

(57) ABSTRACT

A fluid control system for pulse delivery of a fluid include a flow channel, an isolation valve to initiate and terminate a pulse of fluid from the flow channel, and a pulse mass flow controller (MFC). The MFC includes a control valve to control flow of fluid in the flow channel, a flow sensor to measure flow rate in the flow channel, and a controller to control flow of fluid through the control valve and switching of the isolation valve, to control a mass of fluid delivered during the pulse of fluid. Controlling the flow of fluid through the control valve can be based on feedback from the flow sensor during the pulse initiated and terminated by the isolation valve.

22 Claims, 9 Drawing Sheets

(56) References Cited

U.S. PATENT DOCUMENTS

| | | | | |
|---|---|---|---|---|
| 7,335,396 B2* | 2/2008 | Carpenter | C23C 16/45525 | 118/692 |
| 9,151,731 B2* | 10/2015 | Heitz | G01N 33/0006 | |
| 9,348,339 B2 | 5/2016 | Ding et al. | | |
| 9,708,708 B2* | 7/2017 | Isobe | C23C 16/403 | |
| 10,048,105 B2* | 8/2018 | Valentine | G01F 25/0007 | |
| 2003/0183279 A1* | 10/2003 | Chang | G05D 7/0647 | 137/487.5 |
| 2004/0244837 A1* | 12/2004 | Nawata | G05D 7/0635 | 137/487.5 |
| 2005/0189018 A1* | 9/2005 | Brodeur | G01F 1/363 | 137/487.5 |
| 2007/0233412 A1* | 10/2007 | Gotoh | G01F 1/6847 | 702/100 |
| 2010/0192854 A1* | 8/2010 | Nishino | C23C 16/455 | 118/692 |
| 2010/0200083 A1* | 8/2010 | Kouchi | G01F 1/363 | 137/486 |
| 2011/0108126 A1* | 5/2011 | Monkowski | G05D 7/0635 | 137/12 |
| 2012/0295421 A1* | 11/2012 | Brabant | H01L 21/02532 | 438/478 |
| 2014/0051261 A1* | 2/2014 | Ota | C23C 16/30 | 438/770 |
| 2014/0083514 A1* | 3/2014 | Ding | G05D 7/0647 | 137/12 |
| 2014/0099797 A1* | 4/2014 | Terasaki | C23C 16/402 | 438/787 |
| 2014/0190579 A1* | 7/2014 | Ding | G01F 25/003 | 137/487 |
| 2014/0238498 A1 | 8/2014 | Ding | | |
| 2017/0092503 A1* | 3/2017 | Degai | H01L 21/32051 | |
| 2018/0040475 A1* | 2/2018 | Miyakura | C23C 16/30 | |

OTHER PUBLICATIONS

International Search Report and Written Opinion dated Mar. 22, 2019 for International Application No. PCT/US2019/015356, entitled "Method And Apparatus For Pulse Gas Delivery With Isolation Valves,".

* cited by examiner

METHOD AND APPARATUS FOR PULSE GAS DELIVERY WITH ISOLATION VALVES

BACKGROUND

A mass flow controller (MFC) is a device to measure and control the flow of liquids and gases. In general, an MFC includes an inlet port, an outlet port, a mass flow sensor and a proportional control valve that is adjusted to achieve a desired mass flow.

Semiconductor fabrication processes, such as atomic layer deposition (ALD) processes, can involve the delivery of several different gases and gas mixtures in various quantities over several processing steps. Generally, gases are stored in tanks at a processing facility, and gas metering systems are used to deliver metered quantities of gases from the tanks to processing tools, such as chemical vapor deposition reactors, vacuum sputtering machines, plasma etchers, etc. Typically, components such as valves, pressure regulators, mass flow controller (MFCs), mass flow ratio control systems are included in the gas metering system or in a flow path from the gas metering system to a processing tool.

Pulse gas delivery devices have been developed to deliver a pulsed mass flow of a gas to semiconductor process tools. High-speed processes can use pulse gas delivery to manufacture advanced, 3-D integrated circuits that include through-silicon vias (TSVs) to provide die-to-die and wafer-to-water interconnects.

SUMMARY

A fluid control system for pulse delivery of a fluid includes a flow channel, an isolation valve to initiate and terminate a pulse of fluid from the flow channel, and a pulse mass flow controller (MFC). The MFC includes a control valve to control flow of fluid in the flow channel, a flow sensor to measure flow rate in the flow channel, and a controller to control flow of fluid through the control valve and switching of the isolation valve, to control a mass of fluid delivered during the pulse of fluid.

The MFC can be a pressure based MFC or a thermal MFC. The control valve is preferably a proportional valve that produces a flow output that is proportional to a control input (e.g. an electronic control input from a controller). The proportional control valve can be used to control level of flow of fluid.

The controller can control the flow of fluid through the control valve based on feedback from the flow sensor during the pulse initiated and terminated by the isolation valve.

The flow sensor can include a flow restrictor within the flow channel, positioned between the control valve and the isolation valve. The flow sensor can further include an upstream pressure sensor configured to detect an upstream pressure in the flow channel at an upstream position between the control valve and the flow restrictor, and a downstream pressure sensor configured to detect a downstream pressure in the flow channel at a downstream position between the flow restrictor and the isolation valve. The flow sensor configured in such a manner measures flow rate based on the upstream pressure and the downstream pressure.

The controller can be configured to determine an estimated number of moles of fluid delivered as a function of i) the measured flow rate, ii) the detected pressures, iii) a start time of the pulse of fluid, and iv) a stop time of the pulse of fluid. The controller can further be configured to control the flow through the control valve and the switching of the isolation valve based on the estimated number of moles of fluid delivered.

The controller can be configured to determine the estimated number of moles of fluid delivered based on a determination of a residual flow rate and a measured flow rate. The controller can be configured to receive an upstream pressure signal corresponding to the upstream pressure and a downstream pressure signal corresponding to the downstream pressure, and to determine the residual flow rate as a function of i) the downstream pressure and ii) a dead volume between the flow restrictor and the isolation valve.

The controller can be configured to switch, e.g., close, the isolation valve based on a computation of the mass of fluid delivered during the pulse of fluid. In particular, The controller can be configured to determine the estimated number of moles of fluid delivered according to the following equation:

$$\Delta n = \int_{t_1}^{t_2} \left( Q_m - V_{d2} \cdot \frac{dP_d}{dt} \right) \cdot dt, \quad (1)$$

where $\Delta n$ is the estimated number of moles, $Q_m$ is the measured flow rate by the flow sensor, $V_{d2}$ is the dead volume between the flow restrictor and the isolation valve, $P_d$ is the downstream pressure, $t_1$ is the start time of the pulse, and $t_2$ is the stop time of the pulse.

The flow rate can be measured as a function of the upstream pressure, the downstream pressure, and one or more properties of the fluid, such as molecular weight MW and specific heat ratio $\gamma$.

The system can further include a temperature sensor configured to measure temperature of the fluid in the flow channel, in which case the flow rate can be further measured as a function of the temperature of the fluid.

The controller can be configured to receive a control signal from a host controller, the control signal including an identification of the fluid, a desired number of moles of the pulse of fluid, a duration of the pulse of fluid, and number of repeated pulses.

The isolation valve can be integrated into the pulse MFC or can be external to the pulse MFC. For example, the external isolation valve can be a 3-way valve coupled to a process chamber and a dump line. The system can include plural external isolation valves. One of the isolation valves can be coupled to a process chamber and another of the isolation valves can be coupled to a dump line.

A method of delivering a pulse of fluid includes controlling flow of fluid into a flow channel with a control valve; measuring flow rate in the flow channel with a flow sensor; controlling switching of an isolation valve to initiate and terminate a pulse of fluid from the flow channel; and controlling flow of fluid through the control valve and switching of the isolation valve to control a mass of fluid delivered during the pulse of fluid.

Controlling the flow of fluid through the control valve can be based on feedback, e.g. feedback from the flow sensor, during the pulse initiated and terminated by the isolation valve.

The method can further include detecting an upstream pressure in the flow channel at an upstream position between the control valve and a flow restrictor positioned between the control valve and the isolation valve; and detecting a downstream pressure in the flow channel at a downstream position between the flow restrictor and the isolation valve.

Measuring flow rate in the flow channel can be based on the upstream pressure and the downstream pressure.

The method can further include determining an estimated number of moles of fluid delivered as a function of i) the measured flow rate, ii) the measured pressures, iii) a start time of the pulse of fluid, and iv) a stop time of the pulse of fluid. The flow of fluid through the control valve and the switching of the isolation valve can be controlled based on the estimated number of moles of fluid delivered.

Embodiments of the present invention provide several advantages. Inclusion of an isolation valve controlled by the MFC, e.g., controller based on estimated number of moles of gas delivered, allows embodiments to speed up the pulse gas delivery, to improve the accuracy of pulse gas delivery, to match the desired pulse shape, to simplify the pulse gas delivery, to save gas usage, to minimize gas species cross contamination in chamber, and to eliminate MFC control valve leak issue. Embodiments of this invention can provide a comprehensive solution for fast pulse delivery applications using mass flow controllers such as ALD and TSV processes.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

Fluid control systems for pulse delivery of a fluid, e.g. a process gas in a semiconductor manufacturing process or chemical process, are provided. The fluid control systems include a mass flow controller (MFC) and an isolation valve to initiate and terminate one or more pulses of fluid from a flow channel.

An industrial process may require a desired number of moles of a fluid to be delivered during a pulse of fluid being delivered to a process chamber.

The 'mole' is the unit of measurement for amount of substance in the International System of Units (SI) having a unit symbol mol. A 'mole' is defined as the amount or sample of a substance that contains as many constitutive particles, e.g., atoms, molecules, ions, electrons, or photons, as there are atoms in 12 grams of carbon-12 (12C), the isotope of carbon with standard atomic weight 12 by definition. This number is expressed by the Avogadro constant, which has a value of approximately $6.022140857 \times 10^{23}$ mol-1. The mole is widely used as a convenient way to express amounts of reactants and products of chemical reactions. The molar volume (symbol $V_m$) is the volume occupied by one mole of a substance at a given temperature and pressure. It is equal to the molar mass (M) divided by the mass density ($\rho$).

Previous approaches to pulse gas delivery include turning flow of gas on and off on a MFC by a host controller. Another prior approach uses charge and discharge volume to deliver pulses by measuring the volume pressure. The disadvantages of these previously known approaches include the high work load that is put on the host controller, which has to calculate and adjust flow rate to deliver the required amount of gas. As the pulse width becomes short, the communication jittering between the host controller and the MFC degrades the performance of pulse gas delivery in terms of repeatability and accuracy. The pulse shape is not ideal for prior pulse MFCs, especially for pressure based pulse MFCs, which tend to have long tails (see, e.g., FIG. 7A and associated description).

Figure 1:
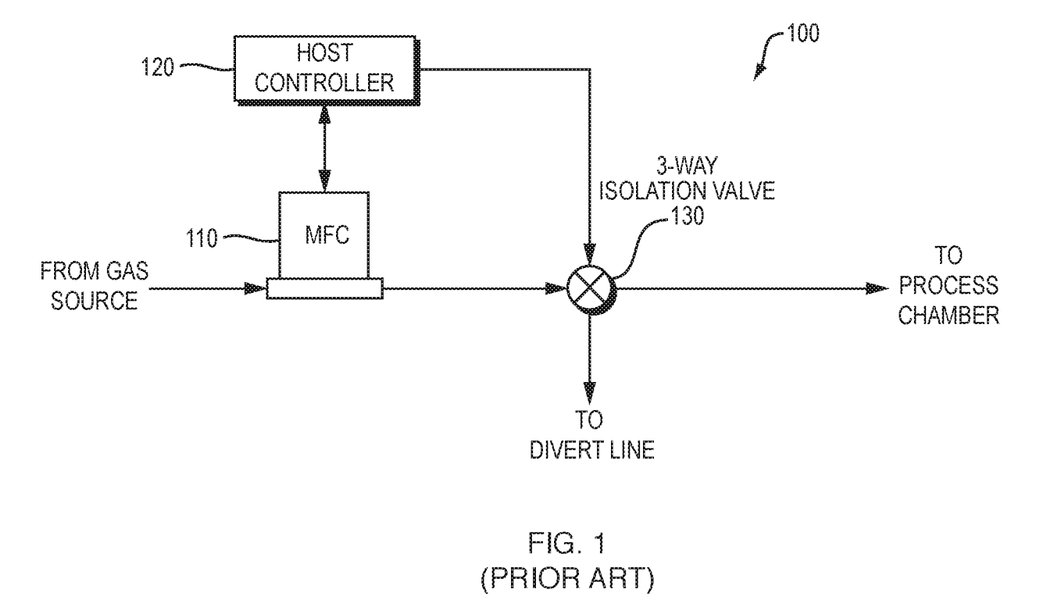
FIG. 1 illustrates a prior pulse gas delivery system using a thermal mass flow controller (MFC) and a divert line.

FIG. 1 illustrates a prior pulse gas delivery system 100 using a thermal mass flow controller (MFC) 110, a host controller 120, and a 3-way valve 130 connected to a divert line and a process chamber. A host controller 120 instructs the MFC 110 to provide a constant flow rate of gas from a gas source and activates the 3-way valve 130 to switch the flow to the process chamber or to the divert line based on desired pulse duration times. The system 100 does not use feedback of how much gas is actually delivered to the process chamber. A drawback of pulse gas delivery systems such as system 100 is that the pulse accuracy and repeatability are dependent on the shut-off valve, e.g., 3-way valve 130. Further, the MFC in such a system is always flowing gas, wasting process gas through the divert line, which is undesirable because process gas can be expensive.

Figure 2A:
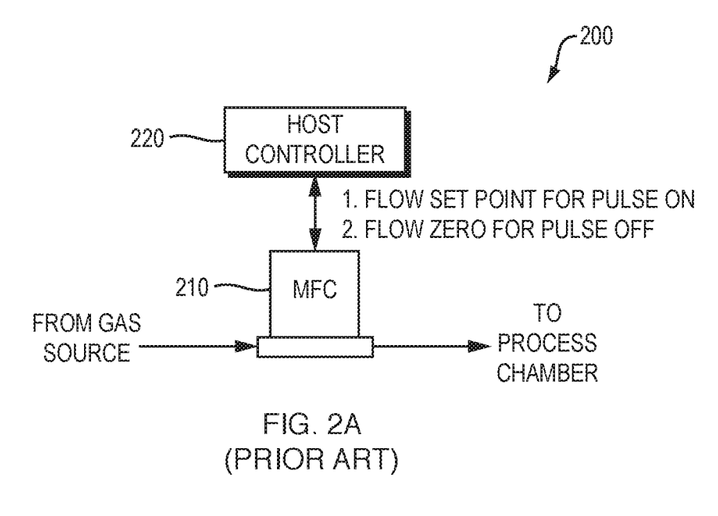
FIGS. 2A-2B illustrate a prior pulse gas delivery system employing a fast response MFC.

FIG. 2A illustrates a prior pulse gas delivery system 200 employing a fast response, thermal MFC 210, such as a thermal MFC based on microelectromechanical system (MEMS) technology. A host controller 220 directly controls the pulse delivery using standard flow rate control. The standard flow rate control mode can include the following processing steps:

a) To initiate flow, the host controller sends flow set point Q at the desired pulse start time ($t_1$).
b) To stop flow, the host controller sends a zero ("0") flow set point at the desired stop time ($t_2$).
c) Repeat the above "n" times for desired number of pulses beginning at time ($t_3$).

Figure 2B:
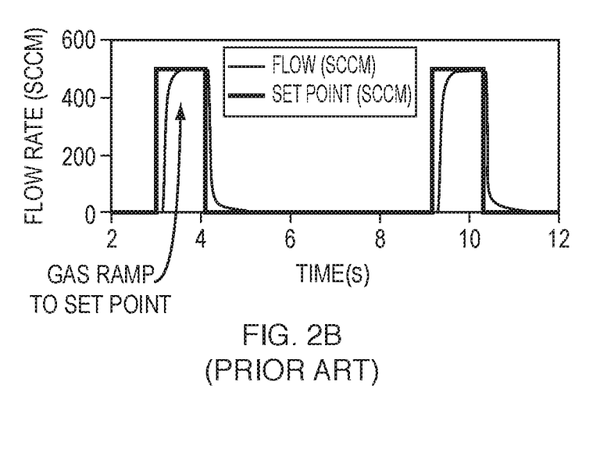

FIG. 2B is a graph illustrating an example of desired flow rate ("set point") and actual flow rate ("flow") using the system 200 of FIG. 2A in standard rate control mode.

There are several drawbacks to the prior approach illustrated in FIGS. 2A-2B. The MFC shows fast control (e.g., <500 msec), but it may not be fast enough for certain ALD and TSV process requirements. The MFC responds to set points, but does not adjust for initial gas ramp to the set point. The delivery is time based only. There is no feedback of actual amount of gas delivered. Furthermore, digital communications "jitter" between the host controller 220 and the MFC 210 can impact repeatability of the pulse delivery. Also, a thermal MFC that is fast but based on MEMS technology may not be compatible with corrosive gases.

Figure 3A:
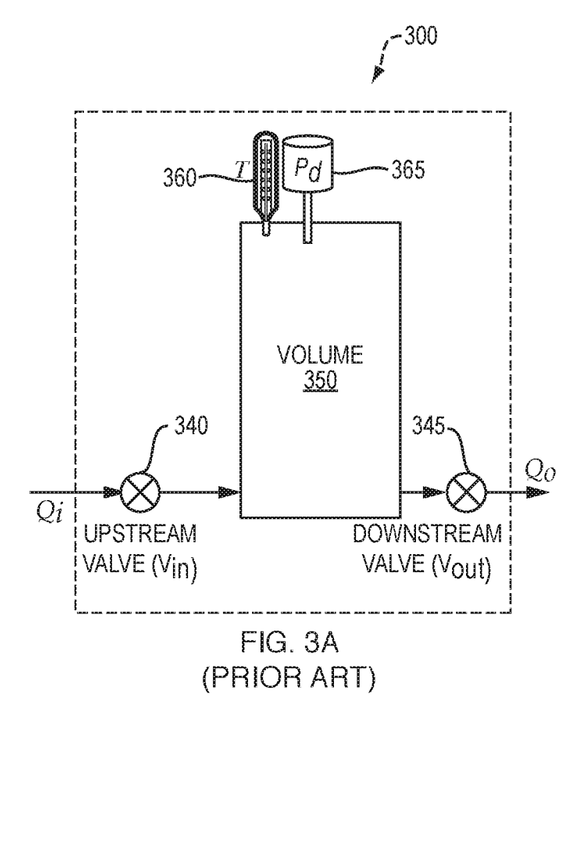
FIGS. 3A-3B illustrate a prior pulse gas delivery system using rate of decay pulse delivery.
Figure 3B:
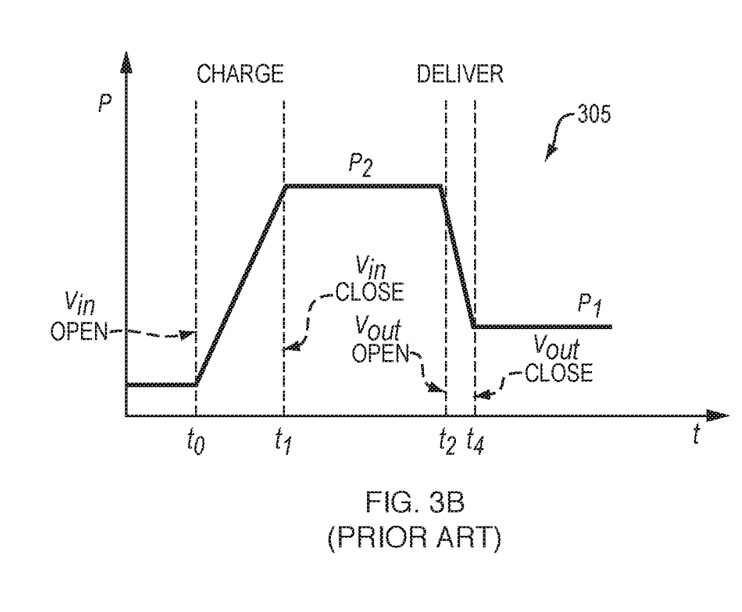

FIG. 3A illustrates a prior pulse gas delivery device 300 using pressure-based pulse gas delivery. Pressure based mole measurement techniques are known in the art and make use of a pressure (P) vs. time (t) response 305 of a gas introduced into a known volume, as illustrated in FIG. 3B. Device 300 includes a chamber 350 providing a known volume, a valve 340 located upstream ("Vin") of the chamber 350, and a valve 345 located downstream ("Vout") of the chamber 350. Also provided are a pressure sensor 365 positioned at chamber 350 and a temperature sensor 360.

Initially, the device 300 may be charged by opening upstream valve 340, while downstream valve 345 is closed, allowing a flow of gas ($Q_i$) to enter the device to fill the chamber 350 over a period of time ("Charge" period $\Delta t = (t_1-t_0)$, FIG. 3B) and a change in pressure to occur. At time $t_1$ and pressure $P_2$, the upstream valve 340 is closed ("Vin CLOSE"). The process then includes a period ($t_2-t_1$) in which the gas in the chamber 350 is allowed to stabilize to a set point. During this period, pressure and temperature measurements are obtained, e.g., by pressure sensor 365 and temperature sensor 360. Upon opening of the downstream valve 345 ("Vout OPEN" at time $t_2$, FIG. 3B), a flow of gas ($Q_o$) exits the device 300 until the valve 345 is closed again ("Vout CLOSE" at time $t_4$), delivering a pulse of gas from the device to a processing tool over a period of time ("Deliver" period $\Delta t = t_4-t_2$,) and a change in pressure ($\Delta P = P_1-P_2$).

Pressure based mole measurement methods and devices are further described in U.S. patent application Ser. No. 13/626,432, published on Mar. 27, 2014 as US 2014/0083514 A1, in the name of Ding, the entire contents of which are incorporated herein by reference. Multiple channel pulse gas delivery employing flow rate determined based on a pressure drop within in a delivery chamber is described in U.S. Pat. No. 9,348,339 B2, issued May 24, 2016 to Ding et al., the entire contents of which are incorporated herein by reference.

The pulse gas delivery illustrated in FIG. 3B can be implemented by a program on a controller of device 300 that executes a delivery recipe. The pulse delivery is initiated by a trigger signal, e.g., a control signal from a host controller. The delivered gas can be estimated based on the principal of ideal gas law, $\Delta n = (\Delta P * V)/(R * T)$.

The approach illustrated in FIGS. 3A-3B has several limitations. The accuracy and repeatability of pulse delivery are dependent on the speed and reliability of the downstream shut-off valve. A shut-off valve with a fast response time is desired. If the valve is aging, however, one may need to implement adaptive adjusting, which adds complexity, or one may need to replace the valve, which typically requires an interruption in the process. Often, the pulse shape (e.g., the pulse width) is not as desired or the pulse does not match the desired square wave sufficiently. Further, the need to charge the chamber 350 with a volume of gas requires time. The gas charge time and stabilization time prior to each pulse limit rapid gas delivery cycle time.

However, an advantage of pressure based mole measurement techniques is that they can be applied without knowledge of the specific gas or gas mixture being measured. The gas flow rate, which is derived from a mass balance over the chamber volume and an application of the ideal gas law, is gas independent, relying on the three state variables of pressure (P), temperature (T), and volume (V) to characterize the behavior of the gas being measured.

Figure 4:
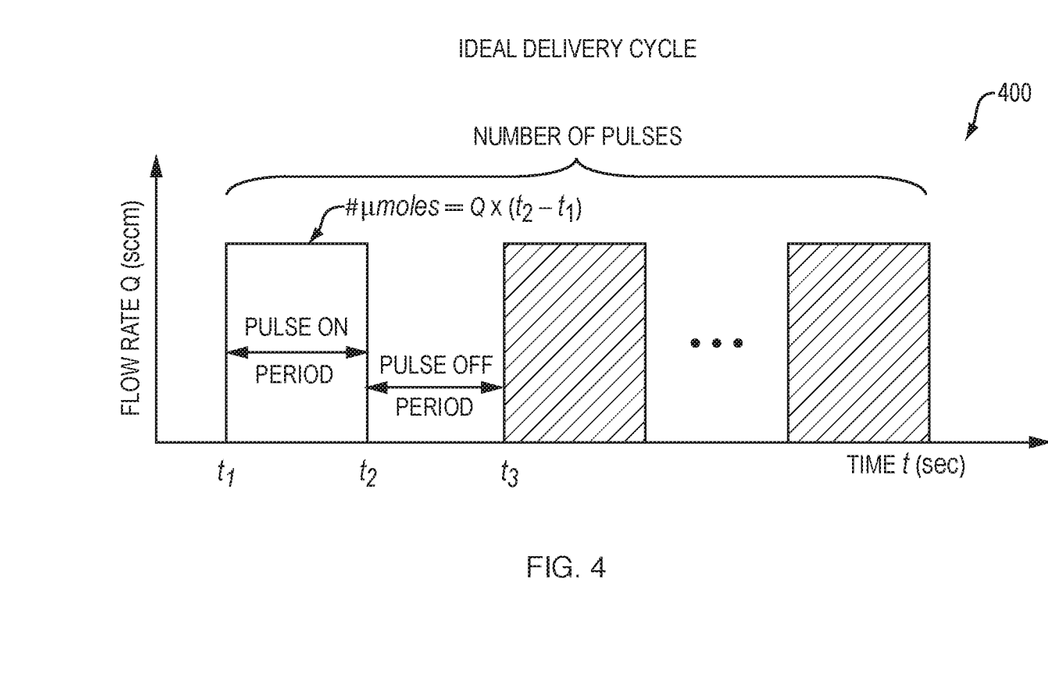
FIG. 4 illustrates pulse delivery employing gas dose defined by product of flow set point (Q) and deliver time ($\Delta t$).

FIG. 4 illustrates pulse delivery employing a gas dose defined by the product of ideal square shape flow set point (Q) and deliver time ($\Delta t$). A gas delivery cycle 400 can be specified by a 'pulse-on' period ($t_2-t_1$), a 'pulse-off' period ($t_3-t_2$), a gas dose (e.g., number of moles of gas per pulse), and a number of pulses per cycle. For pulse delivery, the gas mole dose can be defined as: ideal flow set point (Q) x deliver time ($\Delta t = t_2 - t_1$).

A step function delivery of flow as illustrated in FIG. 4 is ideal but unrealistic due to actual sensor and valve time constants. For practical applications, accuracy and repeatability of dose in the required timeframe are the critical objectives. Thus, it is desirable to accurately and repeatability deliver the gas. To this end, one can use an MFC's computational capability to calculate and adjust flow rate to deliver the required amount of gas in the specified time. In particular, the MFC can be configured to compute the actual delivered gas dose and regulate it to the targeted pulse gas dose.

Figure 5:
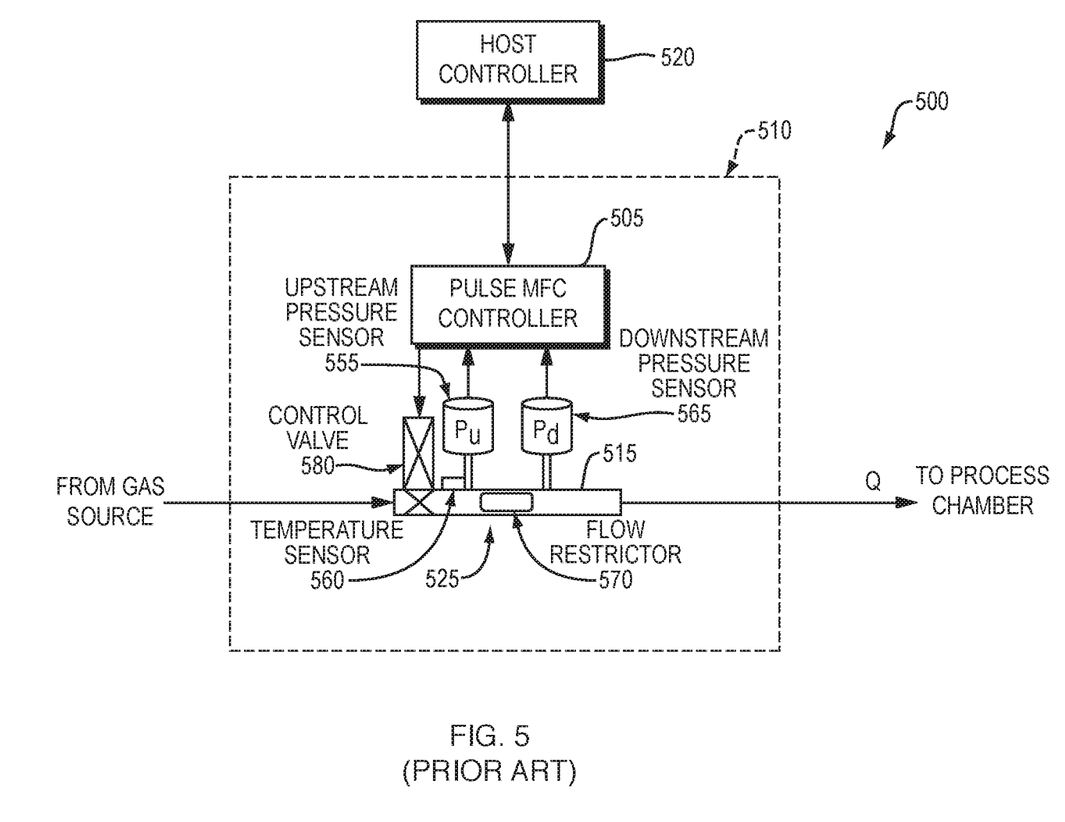
FIG. 5 is a schematic illustration of a prior pressure-based pulse MFC device.

FIG. 5 illustrates a prior system 500 for pulse delivery of a gas. The system 500 includes a pressure-based MFC 510 configured for pulse delivery. A host controller 520 communicates with the MFC 510, e.g., to provide information regarding the desired pulse delivery information, such as pulse mole setpoint, pulse on period, pulse off period and number of repeated pulses, to the MFC 510. To initiate a pulse delivery cycle, the host controller 520 sends a trigger signal to the MFC 510. The MFC 510 includes a control valve 580 (e.g., a proportional control valve) to control flow of fluid from a gas source into a flow channel 515. A controller 505 of the MFC 510 is configured to control flow of fluid through the control valve 580 to control fluid delivered to a process chamber during the pulse of fluid. The controller 505 controls the flow of fluid through the control valve 580 based on feedback from a flow sensor 525, which is provided to measure flow rate (Q) in the flow channel. The flow sensor 525 includes a flow restrictor 570 within the flow channel 515 and upstream and downstream pressure sensors 555 and 565, respectively. The control valve 580 is upstream from the restrictor 570 and the pressure sensors.

The pulse gas delivery amount for the device in FIG. 5 can calculated by the following equation:

$$\Delta n = \int_{t_1}^{t_2} Q \cdot dt \qquad (2),$$

where $\Delta n$ is the delivered gas in mole, Q the measured flow rate by the flow sensor, $t_1$ the start time of the pulse, $t_2$ the end time of the pulse.

Pressure-based pulse MFC gas delivery is further described in International Patent Publication No. WO 2012/116281 A1, entitled "System for and Method of Fast Pulse Gas Delivery" by Junhua Ding et al., the entire contents of which are incorporated herein by reference.

Figure 7A:
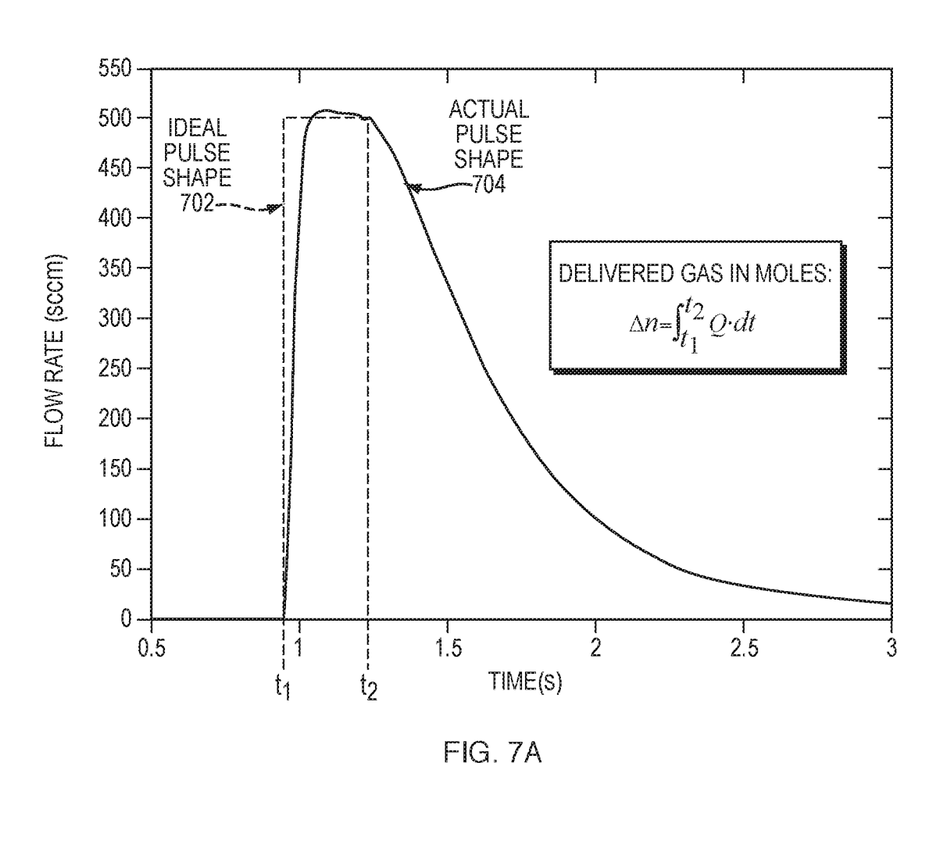
FIG. 7A is a graph illustrating a pulse shape of a gas pulse delivered using an MFC without an integrated isolation valve.

FIG. 7A shows a graph of pulse delivery using the system 500 of FIG. 5. Flow rate is plotted as a function of time for an actual pulse shape 704 superimposed on an ideal pulse shape 702. The ideal pulse has a pulse width of 300 ms. The area under the curve represents the moles of gas delivered. There is a large transient response (e.g., a tail) in the actual pulse delivered, which can be attributed to the volume between the sensor (e.g., downstream pressure sensor 565) and the control valve 580. When the control valve 580 closes, to terminate a pulse, gas that is in the flow channel 515 continues to flow to the process chamber.

If the pulses to be delivered are relatively long in duration, transient flow may not be so important. If the pulses are short, however, the transient flow can be problematic. MFCs are typically calibrated in steady state. The transient response of the MFC control valves, however, can be different from valve to valve.

Figure 6:
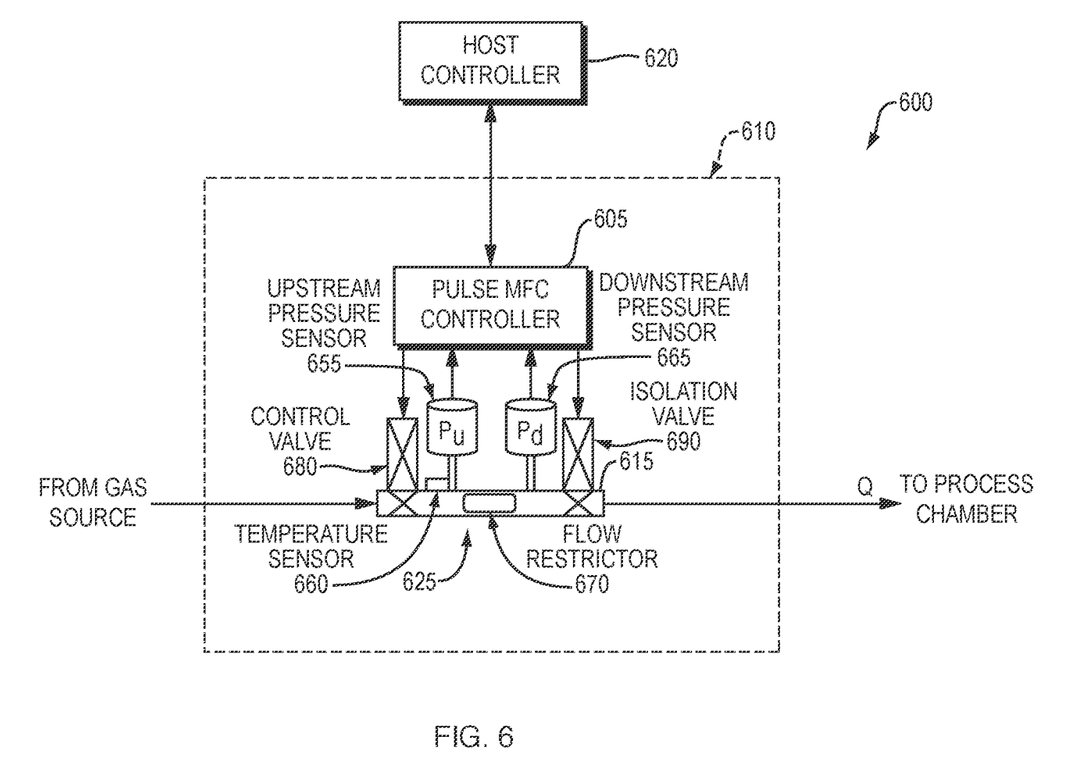
FIG. 6 is a schematic illustration of a pressure-based pulse MFC with an integrated isolation valve.

FIG. 6 illustrates an improved fluid delivery system 600 for pulse delivery of a fluid according to an embodiment of the invention. The system 600 includes a pressure-based pulse MFC 610 with an integrated isolation valve 690. The MFC 610 includes a control valve 680 (e.g., a proportional control valve) to control flow of fluid in a flow channel 615. The isolation valve 690 is configured to initiate and terminate a pulse of fluid from the flow channel 615, e.g., to a process chamber. A pulse MFC controller 605 is configured to control flow of fluid through the control valve 680 and switching of the isolation valve 690, to control a mass of fluid delivered during the pulse of fluid. The controller 605 can control the flow of fluid through the control valve 680 based on feedback from a flow sensor 625 during the pulse initiated and terminated by the isolation valve 690.

In FIG. 6, the control valve 680 is shown positioned before the flow sensor 625, to control flow into the flow channel 615, but the control valve could also be placed after the flow sensor.

The flow sensor 625 is provided to measure flow rate (Q) in the flow channel 615. In the embodiment shown in FIG. 6, the flow sensor 625 includes a flow restrictor 670 within the flow channel 615, positioned between the control valve 680 and the isolation valve 690. The flow sensor 625 further includes upstream and downstream pressure sensors 655 and 665, respectively. The upstream pressure sensor 655 is configured to detect an upstream pressure (Pu) in the flow channel 615 at an upstream position between the control valve 680 and the flow restrictor 670. The downstream pressure sensor 665 is configured to detect a downstream pressure (Pd) in the flow channel 615 at a downstream position between the flow restrictor 670 and the isolation valve 690. The flow sensor is configured to measure flow rate based on the upstream pressure and the downstream pressure, as is known in the art. The system can further include a temperature sensor 660 configured to measure temperature of the fluid in the flow channel 615, in which case the flow rate can be further measured as a function of the temperature of the fluid, as is known in the art.

As illustrated in FIG. 6, the pulse MFC controller 605 is in communication with a host controller 620 to send and receive data relating to the fluid delivery process. The controller 605 can be configured to receive a control signal from the host controller 620, e.g., to specify parameters for pulse delivery of a fluid. The control signal can include an identification of the fluid, a desired number of moles of the pulse of fluid, a desired duration of the pulse of fluid, an off time between pulses and number of pulses. The controller 605 can be configured to control the flow through the control valve 680 and the switching of the isolation valve 690 based on the estimated number of moles of fluid delivered. The controller 605 is configured to adjust the flow set point of the control valve 680 to control flow through the valve during pulse delivery. The controller 605 can also be configured to control the flow set point and the duration of a pulse (e.g., the actual pulse on period) during pulse delivery based on the estimated number of moles delivered. In an embodiment, the controller determines the estimated number of moles of fluid delivered as a function of i) the measured flow rate, ii) a residual flow rate, iii) a start time of the pulse of fluid, and iv) a stop time of the pulse of fluid. The controller 605 is configured to receive an upstream pressure signal corresponding to the upstream pressure (Pu) and a downstream pressure signal corresponding to the downstream pressure (Pd), and to determine the residual flow rate as a function of i) the downstream pressure and ii) the dead volume between the flow restrictor and the isolation valve.

In the system shown in FIG. 6, the fast response isolation valve 690 is added into the pressured based pulse MFC 610 to make the pulse shape more square or ideal. Without the isolation, the long decay of the flow tends to have an adverse effect on the pulse shape as well as on the delivery accuracy after the control valve is closed. Use of the isolation valve 690 also improves the delivery speed such that the system 600 can deliver short duration (100-200 ms) pulses. The control valve 680 and the isolation valve 690 can be simultaneously closed at the end of a pulse, thus eliminating any leaking of fluid to the process chamber.

Figure 8:
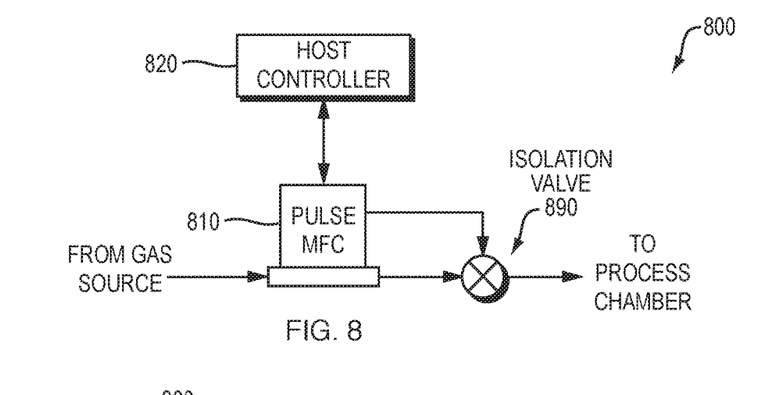
FIG. 8 illustrates an example pulse MFC system with an external isolation valve.
Figure 9:
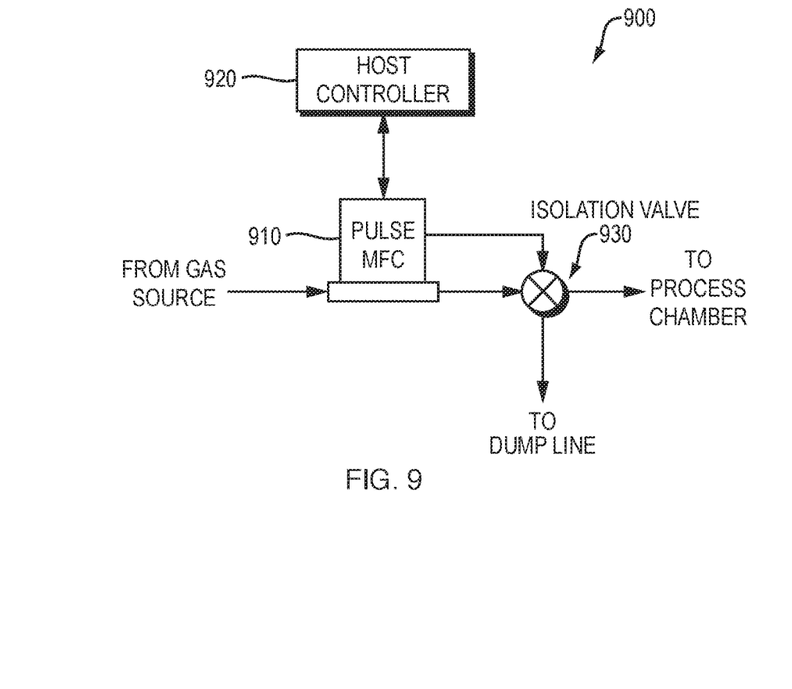
FIG. 9 illustrates an example pulse MFC system with an external isolation valve and a dump line.
Figure 10:
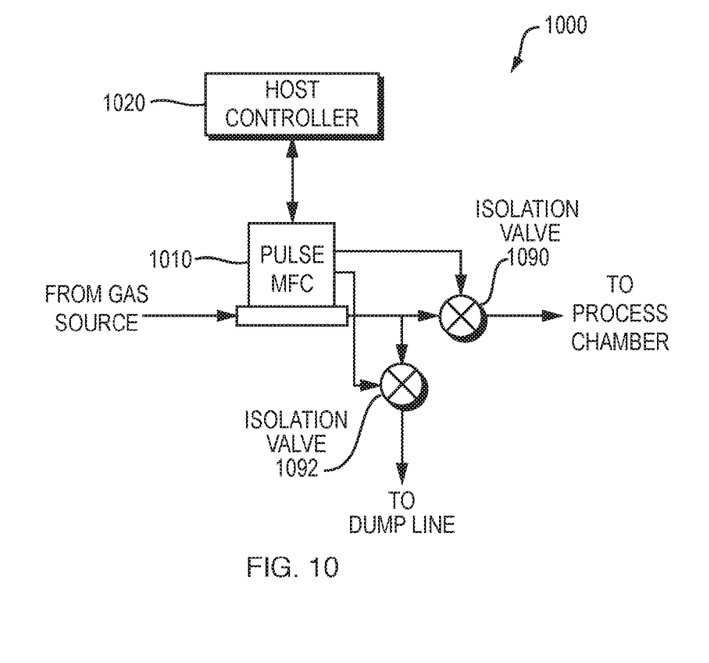
FIG. 10 illustrates an example pulse MFC system with two external isolation valves and a dump line.

The embodiment illustrated in FIG. 6 includes an isolation valve 690 integrated into the pulse MFC 610. The isolation valve can also be mounted outside of pulse MFCs, including thermal MFCs, as illustrated in FIGS. 8-10. Such a solution is compatible with existing pulse MFCs such as MKS P9B MFCs (MKS Instruments, Inc.) with pulse gas delivery capability.

When using an external isolation valve, a dump line (e.g., divert line) can be used, as illustrated in FIGS. 9-10, to let the pulse MFC have a deterministic initial condition for each pulse delivery. The dump line allows for purging of fluid from the flow channel before the start of a pulse.

Embodiments of the present invention are an extension to the existing pulse MFCs, especially for pressure based pulse MFCs. When the end of the pulse delivery period (pulse on period) is reached, the downstream isolation valve is immediately closed to drop the output flow to zero. The pulse gas delivery amount Δn (in moles) for the device in FIG. 6 can be calculated in accordance with Equation 1, reproduced here:

$$\Delta n = \int_{t_1}^{t_2} \left( Q_m - V_{d2} \cdot \frac{dP_d}{dt} \right) \cdot dt, \tag{1}$$

where $Q_m$ is the measured flow rate by the flow sensor (a function of the upstream pressure $P_u$ and the downstream pressure $P_d$ from the flow restrictor as well as the gas temperature T and gas properties such as gas molecular weight MW and the specific heat ratio γ), $V_{d2}$ the dead volume between the flow restrictor and the isolation valve, $P_d$ the downstream pressure measurement, $t_1$ the start time of the pulse, $t_2$ the end time of the pulse.

The term $$\left( V_{d2} \cdot \frac{dP_d}{dt} \right)$$

that includes the dead volume $V_{d2}$ and the downstream $P_d$ is based on the principle of conservation of mass. The term is provided in Equation 1 to compensate for any fluid presence in the space between the flow restrictor and the isolation valve. It can be defined as a residual flow rate. The flow sensor may generate a flow signal after the isolation valve is closed if there is a pressure difference in the flow channel between the upstream and downstream pressure sensors. This flow, however, is not going to the process chamber since the isolation valve is closed. However, there is fluid remaining in the channel and the term in Equation 1 is intended to compensate for this.

In operation, a user can specify the following parameters for mole based pulse delivery: (1) mole delivery set point ($n_{sp}$), (2) the desired (e.g., targeted) time length of the pulse-on period ($T_{on}$), (3) the total pulse-on-and-off period ($T_{total}$), and (4) the number of pulses (N). The information can be transmitted to the MFC 610 via the host controller 620. Based on this information, the controller 605 of the MFC 610 is configured to automatically adjust the flow set point and, optionally, the pulse-on period to precisely deliver within the desired pulse-on period the desired mole amount of gas based on flow rate measured by a flow sensor, e.g., flow sensor 625, according to Equation 1.

Using mole based pulse delivery, the MFC 610 controls, and adjusts as necessary, the flow set point of control valve 680 and, optionally, the actual pulse-on period so as to control the number of moles delivered with each pulse. Based on these parameters, the MFC 610 automatically delivers N pulses of flow in a precise timing sequence, with each pulse delivering Δn moles during the portion of each total pulse period that the MFC is on, and turning the MFC off and closing the isolation valve for the remainder of the total pulse-on-and-off period ($T_{total}$). During pulse delivery, the MFC 610 automatically adjusts the flow set point ($Q_{sp}$) of control valve 680 based on feedback of the estimated number of moles delivered during the pulse in order to precisely deliver the desired number of moles within the targeted pulse-on period ($T_{on}$) for each pulse. The MFC 610 could also adjust the flow set point of control valve 680 and, optionally, the actual pulse-on period based on feedback of the previous pulse delivery.

In certain situations, e.g., during process startup after the system has been sitting idle for a while, the request for mole delivery can be less than the fluid mass in the flow channel volume. This is also referred to as the 'first wafer' problem. For example, the control valve can have a leak, which leads to pressure build up in the flow channel. The pressure might be sufficient to produce the moles need in pulse. In this situation, the MFC may only open the isolation valve, but not the control valve, to deliver the desired pulse of fluid. During the pulse, downstream pressure $P_d$ can be measured and the pulse terminated if desired number of mole of fluid, as calculated from Equation 1, is achieved.

As is known in the art, the flow (Q) through the flow restrictor of the channel can be expressed as a function of the upstream and the downstream pressures ($P_u$ and $P_d$) of the restrictor (i.e., the pressures immediately adjacent to the restrictor), the cross section of the flow path through the restrictor (A), and gas properties such as specific heat ratio γ and molecular weight MW according to the following equation:

$$Q = f_Q(P_u, P_d, A, \gamma, MW) \quad (3).$$

The function $f_Q$ can be obtained by empirical data or experiment. In the case of a flow nozzle as a flow restrictor, the following equation can be used:

$$Q = C \cdot A \cdot P_u \cdot \left(\frac{R \cdot T}{M} \frac{2\gamma}{\gamma-1}\right)^{1/2} \cdot \left(\frac{P_d}{P_u}\right)^{1/\gamma} \cdot \left[1 - \left(\frac{P_d}{P_u}\right)^{(\gamma-1)/\gamma}\right]^{1/2}, \quad (4)$$

where C is the discharge coefficient of the flow restrictor, R the universal gas constant, and T the gas temperature.

Other flow restrictors and corresponding equations describing mass flow through these flow restrictors can be used, and are known in the art.

Figure 7B:
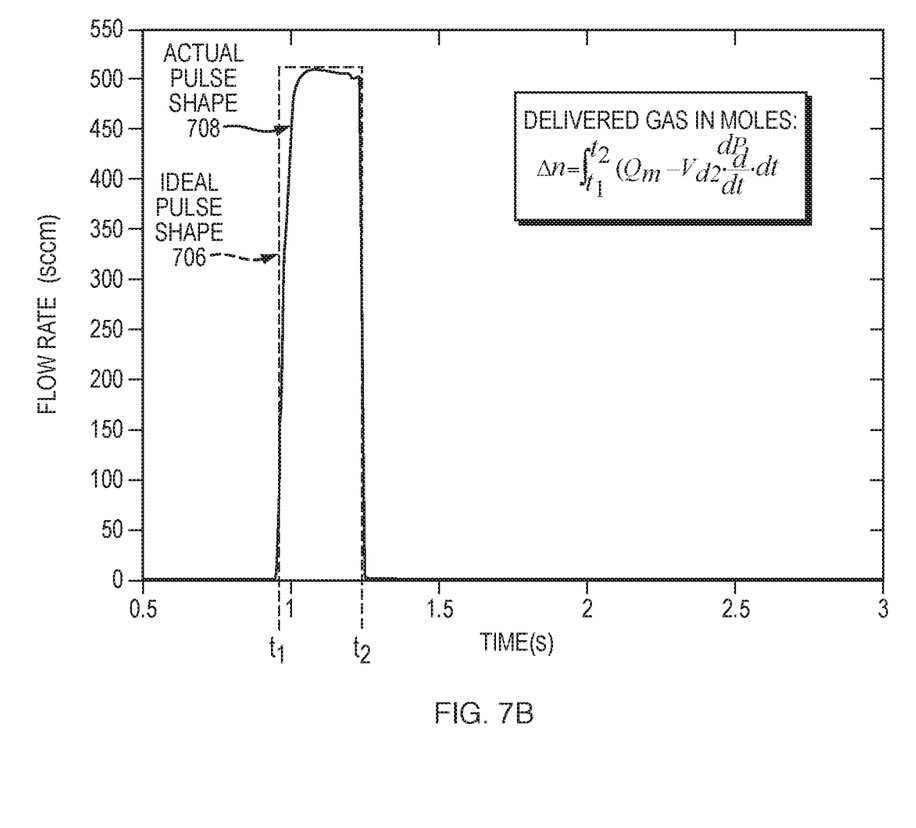
FIG. 7B is a graph illustrating a pulse shape of a gas pulse delivered using an MFC with an integrated fast response isolation valve.

Specific advantages gained by embodiments of this invention over prior methods include improved gas pulse delivery accuracy; matching a required pulse shape by eliminating long pulse tails; and increased speed of delivery, especially for short duration pulses. FIGS. 7A and 7B allow for pulse gas delivery performance comparison with and without an integrated downstream isolation valve.

As described above, FIG. 7A is a graph illustrating a pulse shape obtained using a system without an integrated isolation valve, such as system 500 of FIG. 5. FIG. 7B is a graph illustrating a pulse shape obtained using a system with an integrated fast response isolation valve, such as system 600 of FIG. 6. As in FIG. 7A, two curves are shown in FIG. 7B, the ideal pulse shape 706 having 300 ms pulse width and the actual pulse shape 708 obtained using the system 600. Comparison between the actual pulse shapes of FIGS. 7A and 7B demonstrate that the pulse shape of FIG. 7B provides gas pulse delivery accuracy and matching the ideal pulse shape by eliminating long pulse tails. Eliminating the pulse tails can enable increased speed of delivery.

For pulse MFCs with one or more external isolation valves (FIGS. 8-10), pulse MFCs still directly control the downstream isolation valve(s) based on the pulse delivery requirement. If a dump line is applied, such as shown in FIGS. 9 and 10, pulse MFCs can quickly empty residue gas trapped between the pulse MFC and the downstream isolation valve at the end of the pulse delivery before a new pulse delivery is started.

FIG. 8 illustrates an example of a pulse delivery system 800 including a pulse MFC 810 with an external isolation valve 890. The pulse MFC 810 controls the flow of gas from the gas source and the opening and closing of the isolation valve 890 based on pulse delivery requirement received from a host controller 820.

FIG. 9 illustrates an example of a pulse delivery system 900 including a pulse MFC 910 with an external 3-way isolation valve 930 and a dump line. Unlike the 3-way isolation valve 130 of FIG. 1, the isolation valve 930 is controlled directly by the pulse MFC 910, not by the a host controller 920.

An existing system having an external isolation valve, such as shown in FIG. 1, can be retrofitted with an improved pulse MFC, such as MFC 610, to control the isolation valve to provide improved pulse delivery using the method described herein. The improved pulse MFC would not simply control flow over time, as in a standard MFC, but would compute, at mole level, a mass of fluid delivered during a pulse. The host controller specifies the number of moles to be delivered per pulse along with other desired process parameters. The MFC, however, controls the pulse delivery cycle locally. In this case, the control valve and the isolation valve are controlled based on a calculation of estimated moles delivered, as opposed to just based on time. The computation of estimated moles delivered has to be quick enough and the control signal quick enough to turn off isolation valve in order to terminate the pulse. This suggests that the computation be done locally, at the MFC.

FIG. 10 illustrates an example of a pulse delivery system 1000 including a pulse MFC 1010, two external isolation valves 1090, 1092, and a dump line. Both isolation valves 1090, 1092 are controlled by the pulse MFC 1010 according to pulse delivery requirements. As shown, isolation valve 1090 is configured to open and close flow to a process chamber while isolation valve 1092 is configured to open and close flow to the dump line. The pulse delivery requirements are communicated to the MFC 1010 by host controller 1020.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A fluid control system for pulse delivery of a fluid, the system comprising:
    a flow channel;
    an isolation valve to initiate and terminate a pulse of fluid from the flow channel; and
    a mass flow controller (MFC), including a control valve to control flow of fluid in the flow channel, a flow sensor to measure flow rate in the flow channel, and a dedicated controller to control flow of fluid through the control valve based on feedback from the flow sensor, the dedicated controller connected to the isolation valve to control switching of the isolation valve to initiate and terminate the pulse, to control a mass of fluid delivered during the pulse of fluid, wherein the dedicated controller is configured to determine an estimated number of moles of fluid delivered as a function of i) the measured flow rate, ii) a start time of the pulse of fluid, and iii) a stop time of the pulse of fluid, and wherein the dedicated controller is configured to control the flow through the control valve and the switching of the isolation valve based on the estimated number of moles of fluid delivered.

2. The system of claim 1, wherein the controller controls the flow of fluid through the control valve during the pulse initiated and terminated by the isolation valve.

3. The system of claim 1, wherein the flow sensor comprises:
    a flow restrictor within the flow channel and positioned between the control valve and the isolation valve;
    an upstream pressure sensor configured to detect an upstream pressure in the flow channel at an upstream position between the control valve and the flow restrictor; and
    a downstream pressure sensor configured to detect a downstream pressure in the flow channel at a downstream position between the flow restrictor and the isolation valve, the flow sensor measuring flow rate based on the upstream pressure and the downstream pressure.

4. The system of claim 3, wherein the dedicated controller is configured to close the isolation valve based on a computation of the mass of fluid delivered during the pulse of fluid.

5. The system of claim 3, wherein the dedicated controller is configured to determine the estimated number of moles of fluid delivered based on a determination of a residual flow rate and the measured flow rate.

6. The system of claim 5, wherein the dedicated controller is configured to receive an upstream pressure signal corresponding to the upstream pressure and a downstream pressure signal corresponding to the downstream pressure, and to determine the residual flow rate as a function of i) the downstream pressure and ii) a dead volume between the flow restrictor and the isolation valve as $$\left(V_{d2} \cdot \frac{dP_d}{dt}\right),$$

where $V_{d2}$ is the dead volume between the flow restrictor and the isolation valve and $P_d$ is the downstream pressure.

7. The system of claim 5, wherein the dedicated controller is configured to determine the estimated number of moles of fluid delivered according to the following equation:

$$\Delta n = \int_{t_1}^{t_2} \left(Q_m - V_{d2} \cdot \frac{dP_d}{dt}\right) \cdot dt$$

where $\Delta_n$ is the estimated number of moles, $Q_m$ is the measured flow rate by the flow sensor, $V_{d2}$ is the dead volume between the flow restrictor and the isolation valve, $P_d$ is the downstream pressure, $t_1$ is the start time of the pulse, and $t_2$ is the stop time of the pulse.

8. The system of claim 3, wherein the flow rate is measured as a function of the upstream pressure, the downstream pressure, and one or more properties of the fluid.

9. The system of claim 8, wherein the one or more properties of the fluid include molecular weight MW and specific heat ratio $\gamma$.

10. The system of claim 8, further comprising a temperature sensor configured to measure temperature of the fluid in the flow channel, and wherein the flow rate is further measured as a function of the temperature of the fluid.

11. The system of claim 1, wherein the dedicated controller is configured to receive a control signal from a host controller, the control signal including an identification of the fluid, a desired number of moles of the pulse of fluid, and a duration of the pulse of fluid.

12. The system of claim 1, wherein the isolation valve is integrated into the MFC.

13. The system of claim 1, wherein the isolation valve is external to the MFC.

14. The system of claim 13, wherein the isolation valve is a 3-way valve coupled to a process chamber and a dump line.

15. The system of claim 13, wherein the system includes plural isolation valves, and wherein one of the isolation valves is coupled to a process chamber and another of the isolation valves is coupled to a dump line.

16. The method of claim 1, wherein the dedicated controller is configured to determine the estimated number of moles of fluid delivered based on a determination of a residual flow rate and the measured flow rate.

17. A method of delivering a pulse of fluid, the method comprising:
    controlling flow of fluid into a flow channel with a control valve of a mass flow controller (MFC);
    measuring flow rate in the flow channel with a flow sensor of the MFC;
    controlling switching of an isolation valve to initiate and terminate a pulse of fluid from the flow channel; and
    with a dedicated controller in the MFC, determining an estimated number of moles of fluid delivered, controlling flow of fluid through the control valve based on feedback from the flow sensor, and switching of the isolation valve to control a mass of fluid delivered during the pulse of fluid, wherein the estimated number of moles of fluid delivered is determined as a function of i) the measured flow rate, ii) a start time of the pulse of fluid, and iii) a stop time of the pulse of fluid, and wherein the flow of fluid through the control valve and the switching of the isolation valve are controlled based on the estimated number of moles of fluid delivered.

18. The method of claim 17, wherein controlling the flow of fluid through the control valve is based on feedback from the flow sensor during the pulse initiated and terminated by the isolation valve.

19. The method of claim 17, further comprising:
detecting an upstream pressure in the flow channel at an upstream position between the control valve and a flow restrictor positioned between the control valve and the isolation valve; and
detecting a downstream pressure in the flow channel at a downstream position between the flow restrictor and the isolation valve;
and wherein measuring flow rate in the flow channel is based on the upstream pressure and the downstream pressure.

20. The method of claim 19, further comprising determining a residual flow rate as a function of i) the downstream pressure and ii) the dead volume between the flow restrictor and the isolation valve, and wherein the estimated number of moles of fluid delivered is determined based on the residual flow rate and the measured flow rate.

21. The method of claim 17, wherein the estimated number of moles of fluid delivered is determined based on a determination of a residual flow rate and the measured flow rate.

22. A fluid control system for pulse delivery of a fluid, the system comprising:
a flow channel;
plural isolation valves to initiate and terminate a pulse of fluid from the flow channel, one of the isolation valves being coupled to a process chamber and another of the isolation valves being coupled to a dump line; and
a mass flow controller (MFC), including a control valve to control flow of fluid in the flow channel, a flow sensor to measure flow rate in the flow channel, and a controller to control flow of fluid through the control valve and switching of the isolation valves, to control a mass of fluid delivered during the pulse of fluid.

* * * * *

UNITED STATES PATENT AND TRADEMARK OFFICE
CERTIFICATE OF CORRECTION

PATENT NO. : 10,649,471 B2
APPLICATION NO. : 15/887447
DATED : May 12, 2020
INVENTOR(S) : Junhua Ding, Michael L'Bassi and Gordon Hill Page 1 of 1

It is certified that error appears in the above-identified patent and that said Letters Patent is hereby corrected as shown below:

In the Claims

In Claim 16, Column 12 at Line 49 delete "The method of" and insert --The system of--.

Signed and Sealed this
Eighth Day of September, 2020

Andrei Iancu
*Director of the United States Patent and Trademark Office*